US009004621B2

(12) United States Patent
Honda et al.

(10) Patent No.: US 9,004,621 B2
(45) Date of Patent: Apr. 14, 2015

(54) ELECTRONIC DEVICE, CASE UNIT, AND LOCKING DEVICE (71) Applicant: Fujitsu Limited, Kawasaki-shi, Kanagawa (JP)

(72) Inventors: Masao Honda, Kato (JP); Ikki Tatsukami, Tama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/961,253

(22) Filed: Aug. 7, 2013

(65) Prior Publication Data

US 2014/0084768 A1 Mar. 27, 2014

(30) Foreign Application Priority Data

Sep. 21, 2012 (JP) ................................. 2012-208783

(51) Int. Cl.
H05K 5/00 (2006.01)
H05K 5/02 (2006.01)
G06F 1/16 (2006.01)

(52) U.S. Cl.
CPC ............ H05K 5/0221 (2013.01); G06F 1/1658 (2013.01)

(58) Field of Classification Search
USPC ............... 312/223.2, 215; 292/194, 195, 219, 292/220, 226, 199, 280, DIG. 37
See application file for complete search history.

(56) References Cited

U.S. PATENT DOCUMENTS

| | | | |
|---|---|---|---|
| 6,176,714 B1 | 1/2001 | Ishida et al. | |
| 6,332,658 B1 | 12/2001 | Sato et al. | |
| 6,637,846 B2 * | 10/2003 | Yang | 312/223.2 |
| 7,681,210 B2 * | 3/2010 | Jiang et al. | 720/638 |
| 7,929,289 B2 * | 4/2011 | Tseng | 361/679.39 |
| 8,367,238 B2 * | 2/2013 | Chang | 429/100 |
| 8,369,080 B2 * | 2/2013 | Huang | 361/679.38 |
| 8,379,380 B2 * | 2/2013 | Zhang | 361/679.33 |
| 8,534,777 B2 * | 9/2013 | Gong et al. | 312/223.2 |
| 8,585,104 B2 * | 11/2013 | Lai | 292/163 |
| 2003/0235031 A1 * | 12/2003 | Lo | 361/685 |
| 2004/0012921 A1 | 1/2004 | Hidaka et al. | |
| 2005/0259390 A1 * | 11/2005 | Wu et al. | 361/684 |
| 2007/0007866 A1 * | 1/2007 | Chen | 312/215 |
| 2011/0101835 A1 * | 5/2011 | Wu et al. | 312/223.2 |

FOREIGN PATENT DOCUMENTS

| | | |
|---|---|---|
| JP | 2000-123921 A | 4/2000 |
| JP | 2001-067146 A | 3/2001 |
| JP | 2004-054967 A | 2/2004 |
| JP | 2011-023026 A | 2/2011 |

* cited by examiner

Primary Examiner — Daniel Rohrhoff
(74) Attorney, Agent, or Firm — Westerman, Hattori, Daniels & Adrian, LLP (57) ABSTRACT An electronic device includes: a case; an object member held by the case; an operating portion provided in the case side; a biasing member; a pushing member moved by operating the operating portion; a locking member movable between an engagement position where the locking member engages with the object member held by the case and a disengagement position where the locking member disengages from the object member, biased toward the engagement position by the biasing member, and pushed toward the disengagement position by moving the pushing member.

9 Claims, 10 Drawing Sheets

ELECTRONIC DEVICE, CASE UNIT, AND LOCKING DEVICE

CROSS-REFERENCE TO RELATED APPLICATIONS

This application is based upon and claims the benefit of priority of the prior Japanese Patent Application No. 2012-208783, filed on Sep. 21, 2012, the entire contents of which are incorporated herein by reference.

FIELD

The embodiments discussed herein are related to an electronic device, a case unit, and a locking device.

BACKGROUND

There is known a locking device which locks a member held in a case of an electronic device. Japanese Laid-open Patent Publication No. 2001-67146 discloses a technique relevant to such a locking device.

If the locking device is increased in size, space where the locking device occupies in the case is increased, so the electronic device itself might be increased in size.

SUMMARY

According to an aspect of the embodiments, an electronic device includes: a case; an object member held by the case; an operating portion provided in the case side; a biasing member; a pushing member moved by operating the operating portion; a locking member movable between an engagement position where the locking member engages with the object member held by the case and a disengagement position where the locking member disengages from the object member, biased toward the engagement position by the biasing member, and pushed toward the disengagement position by moving the pushing member, wherein the locking member includes: an engagement portion engageable with and disengageable from the object member; and a groove portion recessed more deeply than the engagement portion; the pushing member includes a projection portion, and the projection portion pushes the locking member toward the disengagement position by moving the pushing member, while the projection portion is sliding on an inner side surface of the groove portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
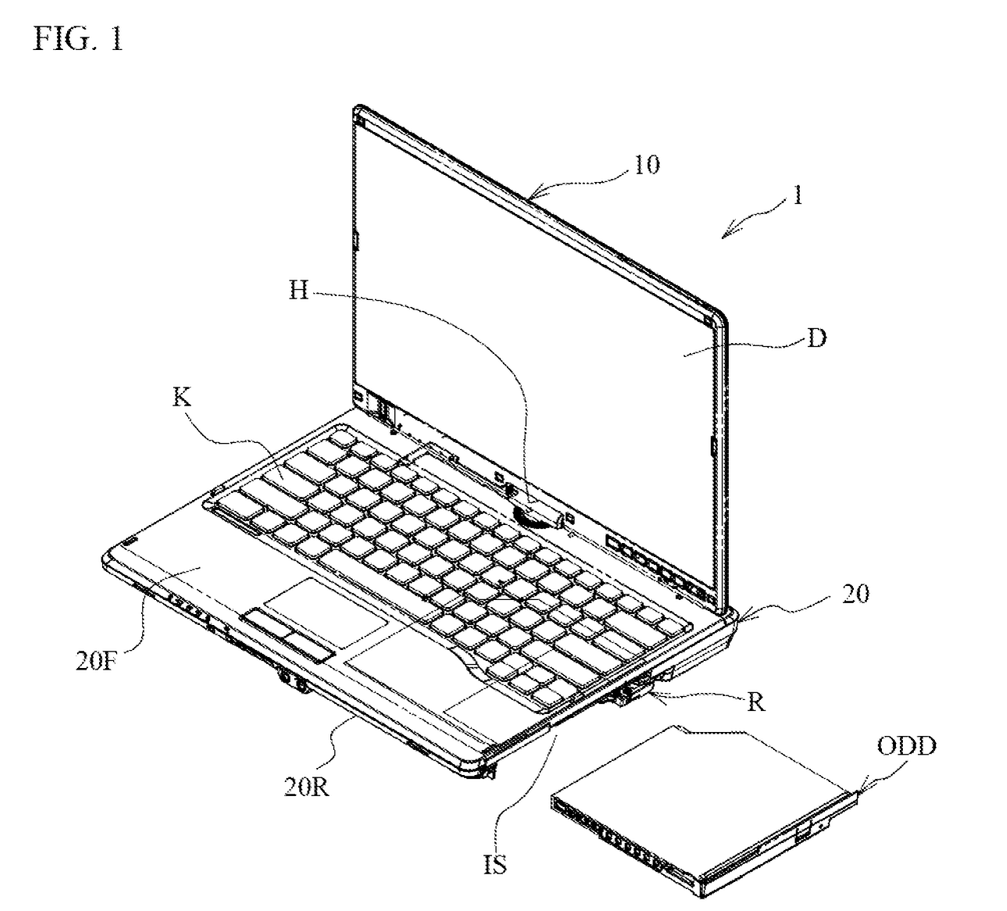
FIG. 1 is an explanatory view of a notebook computer according to the present embodiment.

A notebook computer will be described as an example of an electronic device. FIG. 1 is an explanatory view of a notebook computer according to the present embodiment. A notebook computer 1 includes housings 10 and 20. The housings 10 and 20 are openably/closably and rotatably connected with each other by a two-axis hinge H. The housing 10 is provided with a display D for displaying images. The housing 20 includes a front case (hereinafter referred to as case) 20F and a rear case (hereinafter referred to as case) 20R. The case 20F is provided at its upper surface with a keyboard K for operating the notebook computer 1. An optical disk drive ODD is detachably housed in the housing 20. The housing 20 is provided at its side surface with an insertion slot IS through which the optical disk drive ODD is inserted into the housing 20. Also, the housing 20 is provided with a locking device R for locking the optical disk drive ODD housed in the housing 20. FIG. 1 illustrates the notebook computer 1 from which the optical disk drive ODD is removed. Additionally, the housing 20 houses other parts such as a motherboard, a battery, a memory, and a hard disk.

Figure 2:
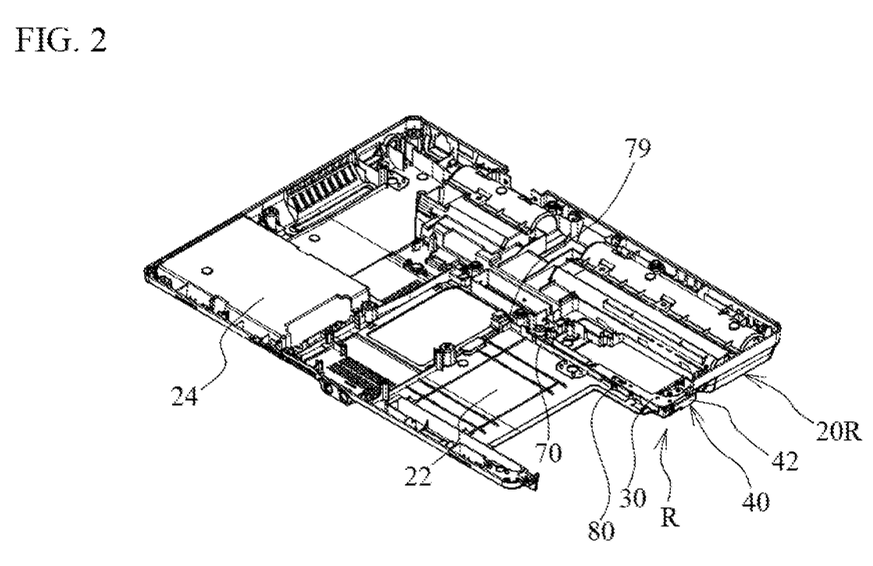
FIG. 2 is a perspective view of a case.
Figure 3:
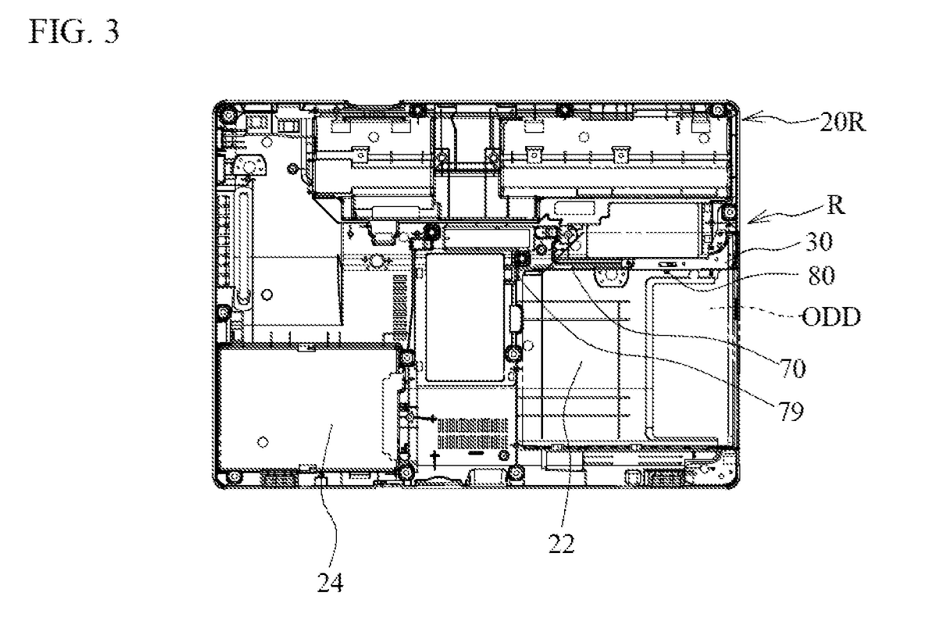
FIG. 3 is a front view of the case holding an optical disk drive.

FIG. 2 is a perspective view of the case 20R. FIG. 2 illustrates the case 20R and the locking device R attached thereto. The case 20R and the locking device R are an example of a case unit. The case 20R includes a holding portion 22 for holding the optical disk drive ODD. The case 20R holds the optical disk drive ODD. The case 20R is provided with a holding portion 24 for holding the hard disk. FIG. 3 is a front view of the case 20R holding the optical disk drive ODD. In FIG. 3, the optical disk drive ODD is illustrated in a broken line. The locking device R is arranged along the side surface of the optical disk drive ODD. The optical disk drive ODD is an example of an object member held by the case.

Figure 4:
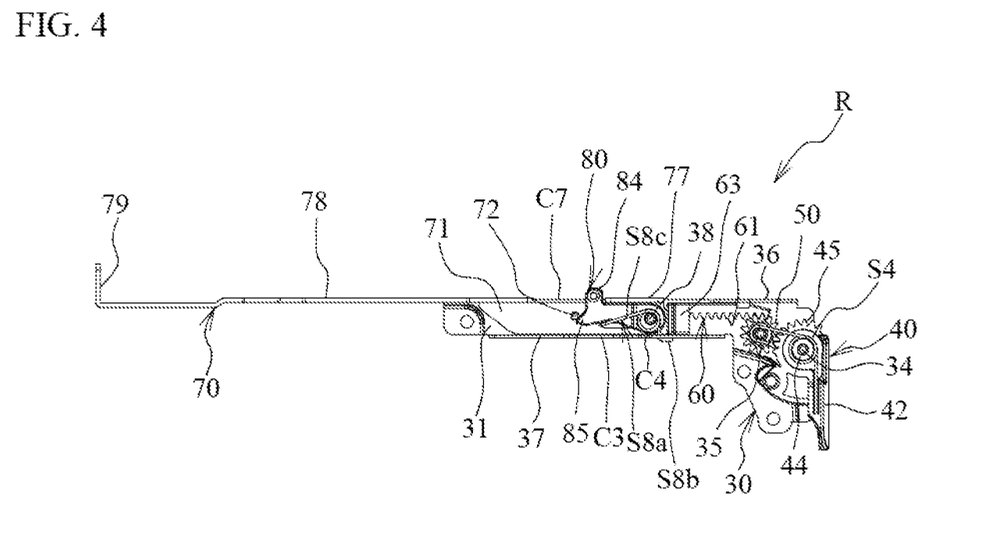
FIG. 4 is an explanatory view of a locking device.
Figure 5:
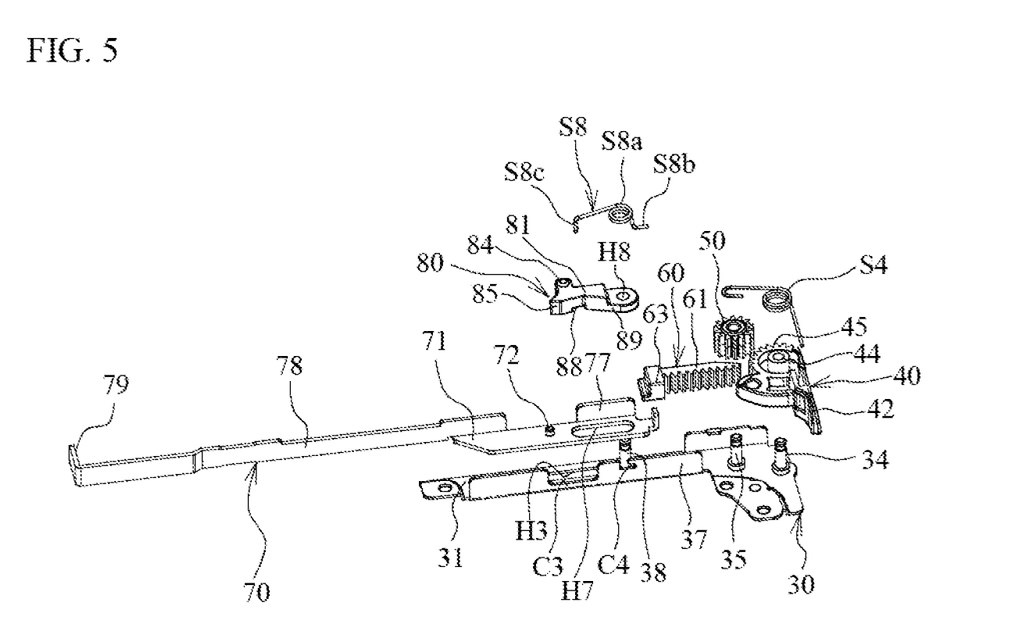
FIG. 5 is an exploded perspective view of the locking device.

FIG. 4 is an explanatory view of the locking device R. FIG. 4 is a view of the locking device R when viewed from the bottom surface side of the case 20R. FIG. 5 is an exploded perspective view of the locking device R. The locking device R includes a support plate 30, a lever 40, a gear 50, a rack 60, a slider 70, and a locking member 80. The support plate 30 is secured to the case 20R side, and supports the lever 40, the gear 50, the rack 60, the slider 70, and the locking member 80 for movement. The slider 70 is arranged between the support plate 30 and the locking member 80. The lever 40 is supported for operation by the support plate 30. The slider 70 is an example of a pushing member moved by operating the operating member. The support plate 30 is an example of a support portion that supports the operating member for operation and that supports the pushing member for movement.

When the lever 40 is operated, the slider 70 slides in conjunction with the gear 50 and the rack 60. In response to the sliding of the slider 70, the locking member 80 is pushed by the slider 70 so as to move between an engagement position where the locking member 80 engages with and locks the optical disk drive ODD and a disengagement position where the locking member 80 disengages therefrom. After the locking member 80 is unlocked and the lever 40 is further operated, the slider 70 further slides toward the lever 40 side and pushes the optical disk chive ODD out of the case 20R. Additionally, the locking member 80 engages with and locks a hollow formed in the side surface of the optical disk drive ODD.

The support plate 30 is made of metal. The support plate 30 includes a base portion 31, and side walls 36 and 37 standing up from edges of the base portion 31. The base portion 31 is formed with an oblong hole H3 for reducing the weight. The rack 60 is arranged between the side walls 36 and 37. The base portion 31 is formed with spindle portions 34, 35, and 38. The spindle portion 34 is inserted into a cylindrical portion 44 of the lever 40 to rotatably support the lever 40. The spindle portion 35 supports the gear 50 for rotation. The spindle portion 38 penetrates through an oblong hole H7 of the slider 70 and a hole H8 of the locking member 80, so the locking member 80 is swingably supported.

The lever 40 is made of a synthetic resin. The lever 40 includes: a handle portion 42 extending radially outward from the cylindrical portion 44; and a gear portion 45 partially formed in the cylindrical portion 44 in the circumferential direction and meshing with the gear 50. The rack 60 is formed at its linear side surface with a gear portion 61. The gear portion 61 engages with the gear 50. An inserting piece 76 standing up at the end of the slider 70 is inserted into a connecting portion 63 of the rack 60, so the rack 60 is connected with the slider 70. When a user holds the handle portion 42 and rotates the lever 40, the gear 50 rotates and the rack 60 and the slider 70 slide linearly. The rack 60 converts the rotational movement of the Rear 50 into the linear movement. The gear 50 and the rack 60 are an example of a transmission member that transmits the operation of the lever 40 to the slider 70.

The cylindrical portion 44 is surrounded by a spring S4, and one end thereof pushes the lever 40 and the other end thereof engages with the spindle portion 35. The spring S4 biases the lever 40 toward an initial position. The initial position of the lever 40 is a position in the state where the locking member 80 is positioned at the engagement position.

The slider 70 includes a base portion 71, side walls 77 and 78, and a pushing portion 79. The slider 70 and the support plate 30 are arranged with the base portions 71 and 31 overlapping each other. The base portion 71 is formed with the oblong hole H7 extending in the longitudinal direction of the slider 70. The inserting piece 76 is formed at the end portion of the base portion 71 near the lever 40. The side walls 77 and 78 stand up from the base portion 71. An escape portion C7 in which a wall is not provided is provided between the side walls 77 and 78. The oblong hole H7 is formed in the vicinity of the side wall 78. The pushing portion 79 is formed at the end portion of the side wall 78, that is, the end portion distant from the lever 40 and is bent from the side wall 78. The pushing portion 79 pushes the rear portion of the optical disk drive ODD in response to the movement of the slider 70. A projection portion 72 projects from the surface of the base portion 71 facing the locking member 80. The projection portion 72 pushes the locking member 80 in response to the sliding of the slider 70, so the locking member 80 is pushed from the engagement position to the disengagement position. The projection portion 72 has a pin shape, but may have a pillar shape or a cylindrical shape. Additionally, since the slider 70 is made of metal and has a thin plate shape, the projection portion 72 may be formed by pressing process or drawing process.

The locking member 80 is made from a synthetic resin. The locking member 80 will be described later in detail. A spring S8 biases the locking member 80 toward the engagement position. The spring S8 includes: a coil portion S8a wound to have a coil shape: and arm portions S8b and S8c extending from the coil portion S8a. The coil portion S8a is wound around the spindle portion 38 supporting the locking member 80 for swinging. The arm portion S8b engages with a cutout portion C4 formed in the side wall 37 of the support plate 30. The support plate 30 is secured to the case 20R side. Thus, the arm portion S8b is an example of a first arm portion that is continuous with the coil portion and that engages with the case side. The arm portion S8c is attached to the locking member 80 side. The arm portion S8c is an example of a second arm portion.

When a user rotates the lever 40 counterclockwise against the biasing force of the spring S4 from the state illustrated in FIG. 4, the slider 70 slides toward the lever 40, and the projection portion 72 pushes the lever 40 toward the disengagement position against the biasing force of the spring S8. The pushing portion 79 pushes the optical disk drive ODD afterwards. When the user releases the lever 40, the lever 40 is rotated clockwise by the biasing force of the spring S4, the slider 70 slides away from the lever 40, and the projection portion 72 also slides away from the locking member 80. Therefore, the locking member 80 is moved toward the engagement position by the biasing force of the spring S8.

Figure 6A:
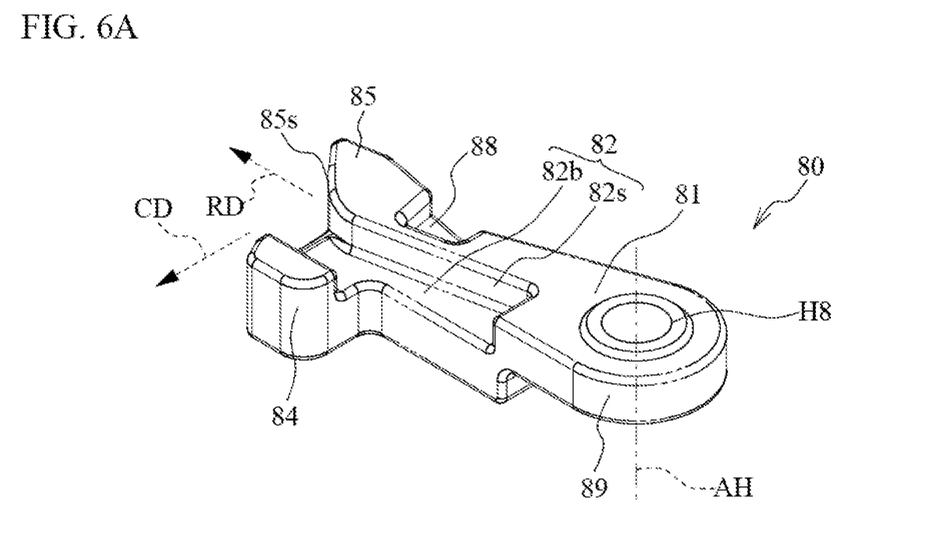
FIGS. 6A to 6C are explanatory views of a locking member.
Figure 6B:
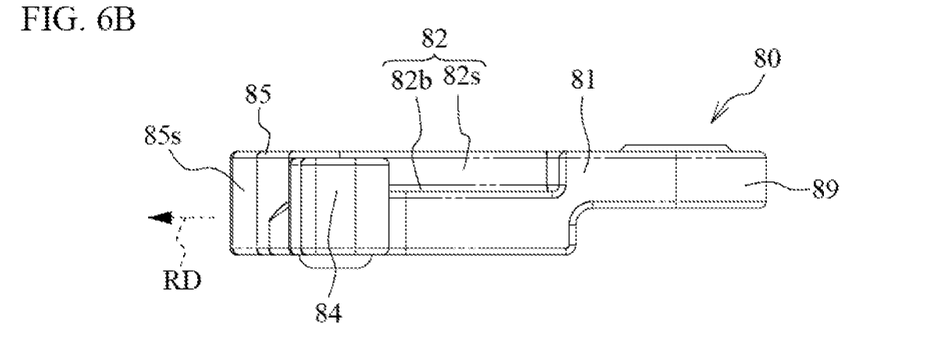
Figure 6C:
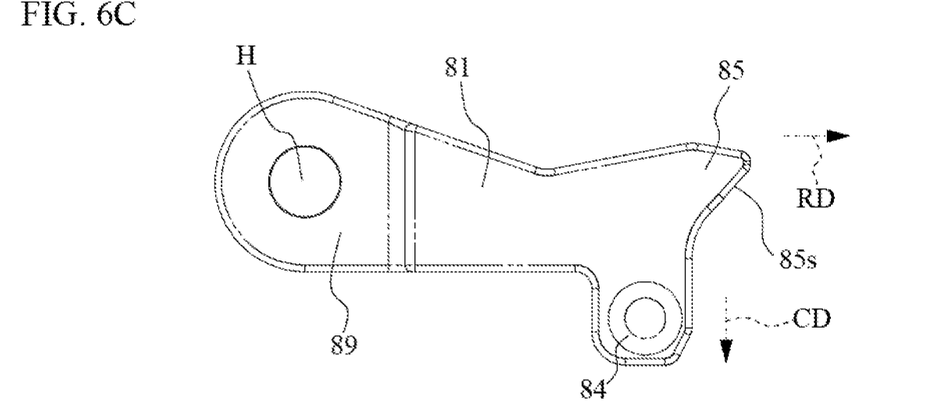

FIGS. 6A to 6C are explanatory views of the locking member 80. The locking member 80 includes a body portion 81, an engagement portion 84, an extension portion 85, and a thin portion 89. The body portion 81 is formed at its end with a hole H8 so as to be rotatably supported and is partially formed with a groove portion 82. The spindle portion 38 penetrates through the hole H8, and the locking member 80 is rotatably supported about the axis AH of the hole H8. The body portion 81 extends in the predetermined direction from the end where the hole H8 is formed. The engagement portion 84 projects in the direction CD from the other end of the body portion 81. The direction CD intersects with the longitudinal direction of the body portion 81 and is along the rotational direction of the locking member 80. The extension portion 85 extends in the direction RD from the other end of the body portion 81. The direction RD is the longitudinal direction of the body portion 81, is the radially outward direction from the rotational center of the locking member 80, and is away from the hole H8. The directions CD and RD are included in the plane where the locking member 80 rotates, that is, in the plane perpendicular to the axis AH. The engagement portion 84 and the extension portion 85 project in the different directions from the other end of the body portion 81.

The groove portion 82 is formed toward the end of the body portion 81 from the other end thereof. In other words, the groove portion 82 is formed along the longitudinal direction of the locking member 80. The groove portion 82 is recessed more deeply than the engagement portion 84. The groove portion 82 includes: a bottom surface 82b; and an inner side surface 82s standing up perpendicularly therefrom. The inner side surface 82s extends substantially linearly. The extension portion 85 includes an outer side surface 85s. The outer side surface 85s extends from the end of the extension portion 85 toward the engagement portion 84. The outer side surface 85s is partially curved and is smoothly continuous with the inner side surface 82s of the groove portion 82. The outer side surface 85s is the outer surface of the extension portion 85 in the engagement portion 84 side.

The thin portion 89 is formed with the hole HS and is thinner than each of the engagement portion 84 and the extension portion 85. As illustrated in FIGS. 4 and 5, the coil portion S8a of the spring 58 is arranged on the thin portion 89. Thus, the whole thickness of the locking member 80 including the spring S8 is suppressed. The thickness of the locking member 80 is in the direction of the central axis AH of the hole H8.

A recess portion 88 is formed in the same side where the groove portion 82 of the locking member 80 is formed. The end portion of the arm portion S8c of the spring S8 is arranged in the recess portion 88. Also, as mentioned above, the coil portion S8a is arranged on the rear surface opposite to the surface where the groove portion 82 and the recess portion 88 are formed. Thus, the spring S8 is attached to the locking member 80 such that the coil portion S8a and the arm portion S8c sandwich the locking member 80. This prevents the spring S8 from being removed from the locking member 80. The surface where the groove portion 82 and the recess portion 88 are not provided is an example of a first surface. The surface where the groove portion 82 and the recess portion 88 are provided is an example of a second surface.

Since the coil portion S8a of the spring S8 is wound around the spindle portion 38 for rotatably supporting the locking member 80, the support plate 30 is reduced in size, as compared with a case where the coil portion S8a of the spring S8 is wound around another spindle portion provided separately from the spindle portion 38.

Figure 7A:
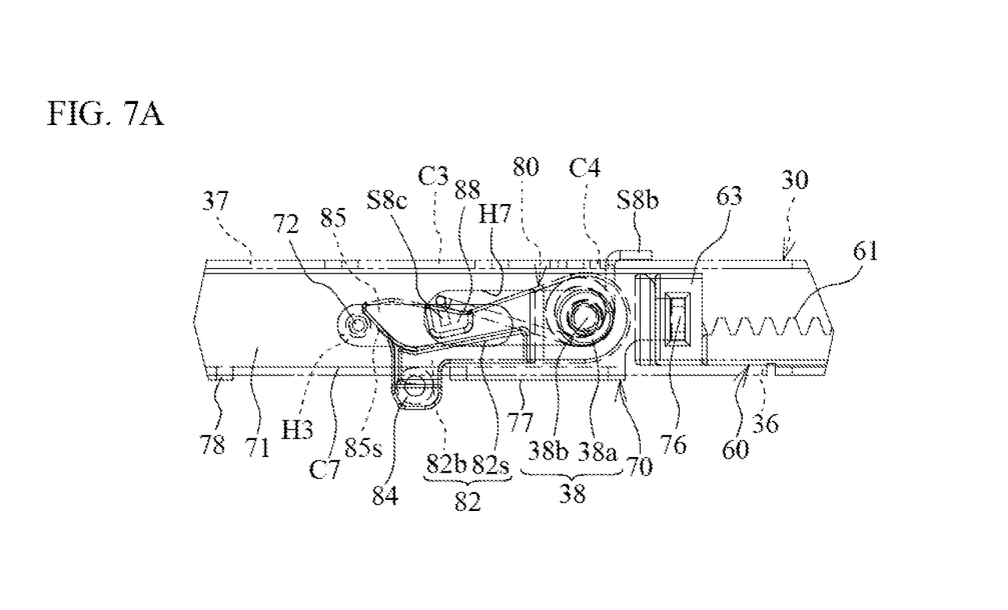
FIGS. 7A and 7B are explanatory views of movement of the locking member from an engagement position to a disengagement position.

Next, a description will be given of the movement of the locking member 80 from the engagement position to the disengagement position. FIGS. 7A, 7B, 8A, and 8B are explanatory views of the movement of the locking member 80 from the engagement position to the disengagement position. The locking member 80 illustrated in FIG. 7A is pushed toward the side wall 77 to be positioned at the engagement position by the biasing force of the spring S8. The engagement portion 84 projects out of the slider 70 through the escape portion C7 formed between the side walls 77 and 78. The engagement portion 84 projecting outwardly through the escape portion C7 engages with the recess provided in the side surface of the optical disk drive ODD so as to lock the optical disk drive ODD. The spindle portion 38 includes: a proximal end 38a close to the base portion 31; and a, body portion 38b extending from the proximal end 38a, having a diameter smaller than that of the proximal end 38a, and penetrating through the hole H8. The proximal end 38a slides in the oblong hole H7. In the state as illustrated in FIG. 7A, the proximal end 38a abuts with an end of the oblong hole H7. The projection portion 72 faces the outer side surface 85s of the extension portion 85.

Figure 7B:
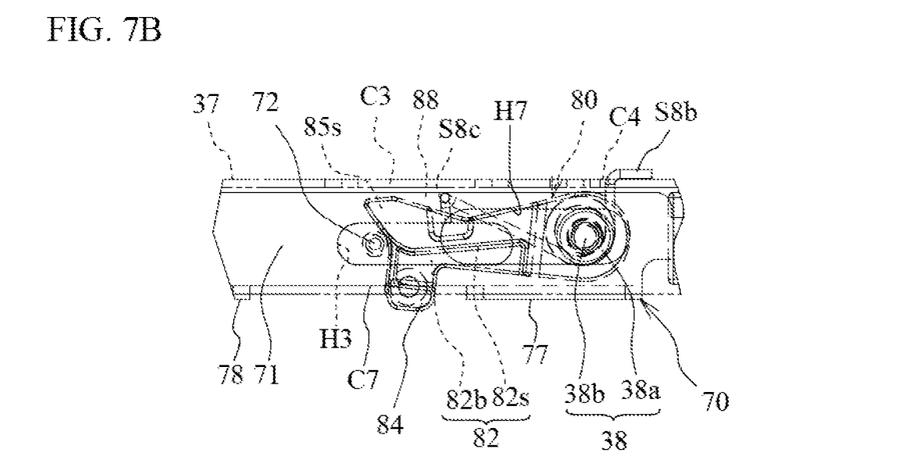

When the lever 40 is rotated, the slider 70 moves linearly relative to the support plate 30, as illustrated in FIG. 7B. The proximal end 38a slides in the oblong hole H7. The projection portion 72 slides to push the outer side surface 85s of the extension portion 85. Therefore, the locking member 80 is rotated clockwise and is pushed toward the disengagement position, and the engagement portion 84 evacuates to the locking device R.

Figure 8A:
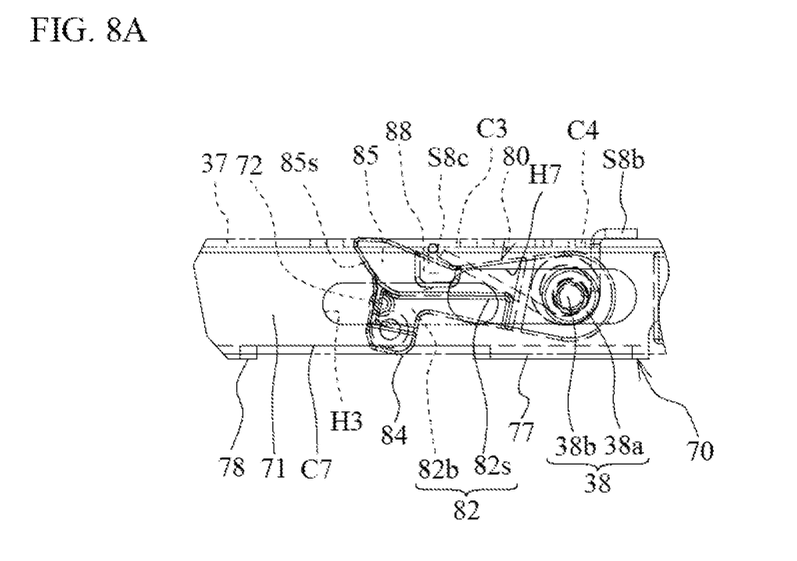
FIGS. 8A and 8B are explanatory views of the movement of the locking member from the engagement position to the disengagement position.
Figure 8B:
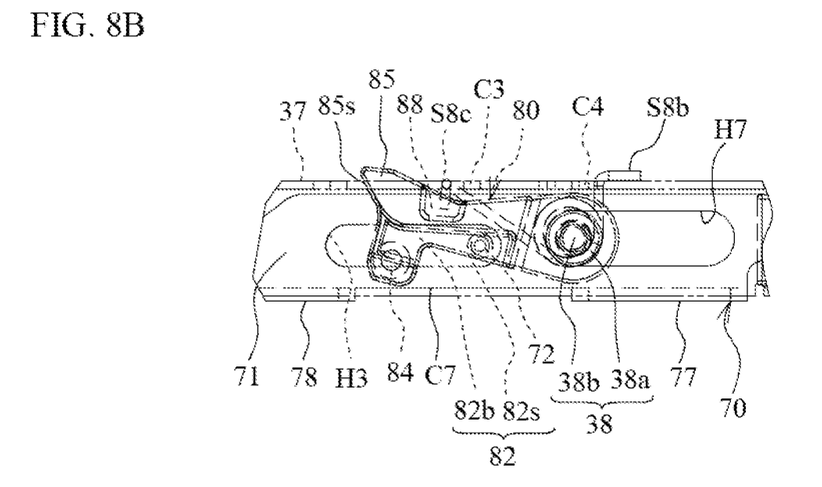

When the slider 70 further slides, the projection portion 72 pushes the locking member 80 while sliding from the outer side surface 85s toward the inner side surface 82s of the groove portion 82, as illustrated in FIG. 8A. Also, the extension portion 85 projects through the cutout portion C3 formed in the side wall 37. When the slider 70 further slides, the projection portion 72 slides on a linear portion of the inner side surface 82s to position the locking member 80 at the disengagement position, as illustrated in FIG. 8B. In this state, the proximal end 38a abuts with the other end of the oblong hole H7. Additionally, the length of the projection portion 72 is set not to come into contact with the bottom surface 82b of the groove portion 82.

Thus, the engagement of the proximal end 38a with the oblong hole H7 restricts the sliding range of the slider 70. This also restricts the rotational range of the lever 40 interlocking with the slider 70. For example, in a case where a stopper directly abutting with the lever 40 is provided for restricting the rotational range of the lever 40 made of a synthetic resin, the lever 40 might be shaved or broken. However, in the present embodiment, the rotational range of the lever 40 is indirectly restricted by the support plate 30 and the slider 70 which are made of metal having a certain rigidity, so the lever 40 is prevented from being broken. The oblong hole H7 is an example of a hole through which the spindle portion penetrates to define a movable range of the pushing member.

The projection portion 72 slides on not only the inner side surface 82s but also the outer side surface 85s continuous with the inner side surface 82s, and pushes the locking member 80. In such a way, the range where the projection portion 72 abuts with the locking member 80 is ensured. In a case where such a range is short, in order to push the locking member 80 toward the disengagement position, the locking member 80 has to be rotated by a large angle relative to the movable distance of the projection portion 72. This might increase the load on the slider 70 and the locking member 80 in sliding. In the present embodiment, the long range where the projection portion 72 abuts with the locking member 80 is ensured. It is thus possible to reduce the load on the projection portion 72 and the locking member 80 and to move the locking member 80 from the engagement position toward the disengagement position.

The projection portion 72 has a pin shape, and the curved outer circumferential surface thereof slides on the inner side surface 82s and the outer side surface 85s. This can suppress the frictional resistance between the outer circumferential surface of the projection portion 72, and the inner side surface 82s and the outer side surface 85s, thereby smoothly rotating the locking member 80. Also, since the projection portion 72 is integrally formed in the slider 70, the number of the parts is reduced and the cost is reduced, as compared with a case where the slider 70 is attached with a projection portion formed separately therefrom.

Figure 9:
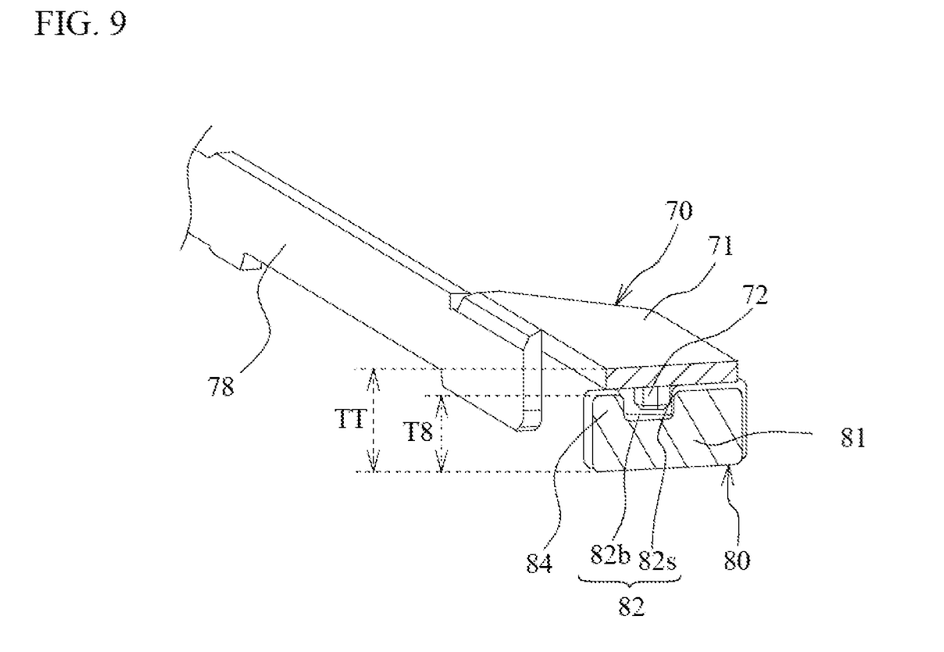
FIG. 9 is a sectional view of a slider and the locking member.

FIG. 9 is a sectional view of the slider 70 and the locking member 80. A thickness T8 indicates a thickness of the engagement portion 84. A thickness TT indicates the whole thickness of the locking member 80 and the slider 70. In other words, the thickness TT indicates the distance from the bottom surface of the locking member 80 to the upper surface of the base portion 71. In such a manner, the bottom surface 82b of the groove portion 82 is positioned within the thickness of the engagement portion 84.

Figure 10A:
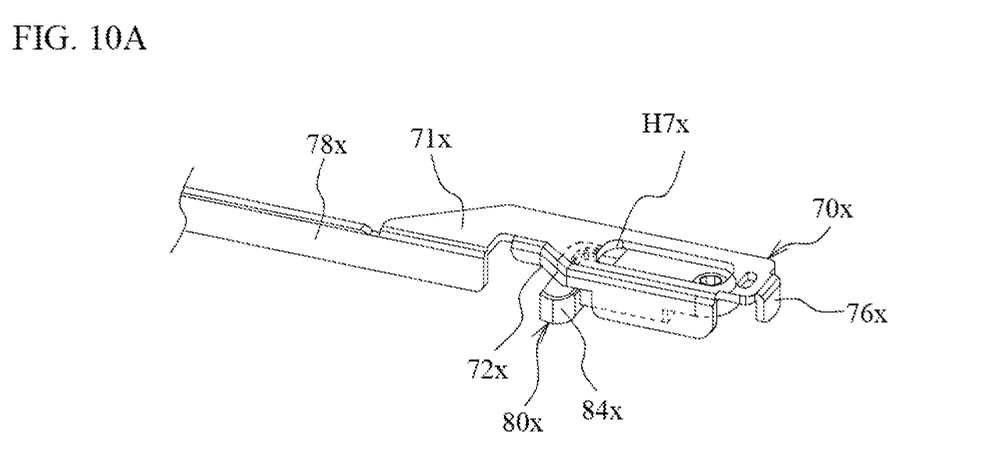
FIGS. 10A and 10B are a slider and a locking member used in a locking device according to a comparative example different from the present embodiment.
Figure 10B:
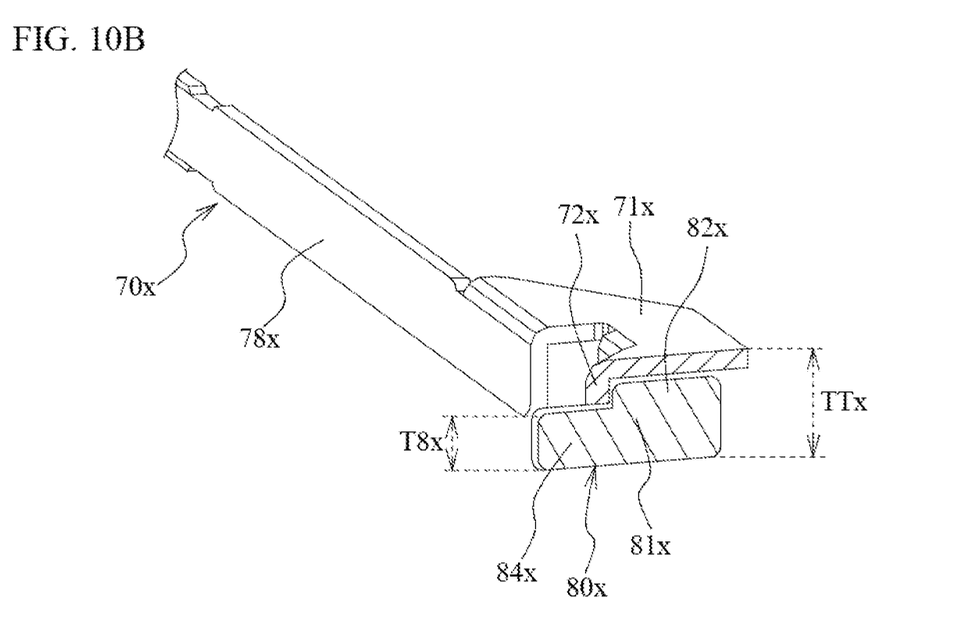

FIGS. 10A and 10B are explanatory views of a slider 70x and a locking member 80x used for a locking device according to a comparative example different from the present embodiment. Additionally, similar components of the present embodiment are designated with similar reference numerals and a description of those components will be omitted. As illustrated in FIG. 10A, the slider 70x includes a side wall 72x bent perpendicularly from a base portion 71x. The side wall 72x extends obliquely with respect to the sliding direction of the slider 70x. As illustrated in FIG. 10B, the locking member 80x includes: a body portion 81x; an engagement portion 84x projecting from the body portion 81x; and a bulging portion 82x projecting from the body portion 81x in the thickness direction thereof. The side wall 72x pushes the locking member 80x from the engagement position toward the disengagement position, while the inner side surface of the side wall 72x slides on the outer side surface of the bulging portion 82x. Herein, a thickness T8x indicates a thickness of the engagement portion 84x, a thickness TTx indicates the whole thickness of the locking member 80x and the slider 70x.

When the thickness T8x in the comparative example is the same as the thickness T8 in the present embodiment illustrated in FIG. 9, the thickness TTx is greater than the thickness. This is because the bulging portion 82x, on which the side wall 72x slides, projects from the body portion 81x in the thickness direction. Also, the side wall 72x is formed by perpendicularly bending an edge of the base portion 71x. Thus, this is because the side wall 72x has to have a certain length to be bent, and the thickness from the upper surface of the base portion 71x to the lower end portion of the side wall 72x is increased.

In the present embodiment, the provision of the groove portion 82 in the locking member 80 suppresses the thickness of the locking member 80. Thus, the locking member 80 is reduced in size, and also the locking device R, the case 20R, and the notebook computer 1 itself are suppressed from being increased in size. Also, the provision of the groove portion 82 distant from the engagement portion 84 ensures the thickness of the engagement portion 84. For example, the engagement portion 84 can be reduced in thickness to reduce the whole thickness of the locking member 80. However, in such a case, the engagement portion 84 which directly engages with the optical disk drive ODD might be deteriorated in durability and might be broken. In the present embodiment, the thickness of the engagement portion 84 is ensured and the whole thickness of the locking member 80 is reduced, thereby ensuring the durability and reducing the whole size of the locking member 80.

In the above embodiment, the notebook computer has been described as an example of an electronic device. However, an electronic device is not limited to this. For example, an electronic device may be a portable device such as a tablet type computer, a mobile phone, a mobile television, an electronic dictionary a PDA, gaming machine, a camera, a music player, a navigation, and a portable projector. Also, for example, an electronic device may be a stationary electronic device such as a desktop type computer, a monitor, a monitor in which a computer is installed, a television, an audio device, a projector, and another household electrical appliance.

In the above embodiment, the optical disk drive ODD has been described as an example of an object member which is locked by the locking device R. However, the object member which is locked is not limited to this. For example, the object member may be a storage medium such as a hard disk and a memory, and may be a battery, a projector, and another member having a hoard shape.

In the above embodiment, the locking device R may not include the support plate 30. For example, the case 20R is integrally formed with the spindle portions 34, 35, and 38, the side walls 36 and 37, and the like.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. An electronic device comprising:
   a case;
   an object member held by the case;
   an operating portion provided in a case side;
   a biasing member;
   a pushing member moved by operating the operating portion;
   a locking member movable between an engagement position where the locking member engages with the object member held by the case and a disengagement position where the locking member disengages from the object member, biased toward the engagement position by the biasing member, and pushed toward the disengagement position by moving the pushing member,
   wherein the locking member includes:
      an engagement portion engageable with and disengageable from the object member; and
      a groove portion recessed more deeply than the engagement portion;
   the pushing member includes a projection portion, and
   the projection portion pushes the locking member toward the disengagement position by moving the pushing member, while the projection portion is sliding on an inner side surface of the groove portion; and
   wherein the pushing member is moved linearly in response to operation of the operating portion, and
   the locking member is swung from the engagement position toward the disengagement position in response to linear movement of the pushing member.

2. The electronic device of claim 1, wherein
   the locking member is supported for rotation about a predetermined axis, and
   the groove portion includes a bottom surface positioned within a thickness of the engagement portion in a direction of the axis.

3. The electronic device of claim 1, wherein
   the locking member includes:
      a body portion provided with the groove portion, one end of the body portion is rotatably supported, the body portion extends from the one end in a predetermined direction;
      an extension portion that extends from another end of the body portion in a longitudinal direction of the body portion, and
      the engagement portion that projects from the another end of the body portion in a direction intersecting with the longitudinal direction,
   an outer side surface of the extension portion is continuous with an inner side surface of the groove portion, and
   the projection portion slides on the outer side surface of the extension portion and the inner side surface of the groove portion.

4. The electronic device of claim 1, wherein
   the projection portion has a pin shape, and
   an outer side surface of the projection portion slides on the inner side surface of the groove portion.

5. The electronic device of claim 1, comprising a spindle portion that supports the locking member for rotation and that is secured to the case,
   wherein the pushing member includes a hole through which the spindle portion penetrates to define a movable range of the pushing member.

6. The electronic device of claim 1, wherein
   the biasing member includes:

a coil portion wound to have a coil shape;
a first arm portion continuous with the coil portion and engaging with the case side; and
a second arm portion continuous with the coil portion and engaging with the locking member side, the coil portion is positioned in a first surface side of the locking member; an end portion of the second arm is positioned at a second surface side opposite to the first surface side of the locking member, and the locking member includes a thin portion that faces the coil portion and that is thinner than the engagement portion.

7. The electronic device of claim 1, comprising:
a support portion that supports the operating portion for operation and that supports the pushing member for movement, and
a transmitting member that transmits operation of the operating portion to the pushing member.

8. A case unit comprising:
a case;
an operating portion provided in a case side;
a biasing member;
a pushing member moved by operating the operating portion, and
a locking member movable between an engagement position where the locking member engages with an object member to be locked and a disengagement position where the locking member disengages from the object member, biased toward the engagement position by the biasing member, and pushed toward the disengagement position by moving the pushing member,
wherein the locking member includes: an engagement portion engageable with and disengageable from the object member; and a groove portion recessed more deeply than the engagement portion,
the pushing member includes a projection portion, and
the projection portion pushes the locking member toward the disengagement position by moving the pushing member, while the projection portion is sliding on an inner side surface of the groove portion, and
wherein the pushing member is moved linearly in response to operation of the operating portion, and
the locking member is swung from the engagement position toward the disengagement position in response to linear movement of the pushing member.

9. A locking device comprising:
an operating portion;
a biasing member;
a pushing member moved by operating the operating portion;
a locking member movable between an engagement position where the locking member engages with an object member to be locked and a disengagement position where the locking member disengages from the object member, biased toward the engagement position by the biasing member, and pushed toward the disengagement position by moving the pushing member;
wherein the locking member includes: an engagement portion engageable with and disengageable from the object member; and a groove portion recessed more deeply than the engagement portion,
the pushing member includes a projection portion, and
the projection portion pushes the locking member toward the disengagement position by moving the pushing member, while the projection portion is sliding on an inner side surface of the groove portion; and
wherein the pushing member is moved linearly in response to operation of the operating portion, and
the locking member is swung from the engagement position toward the disengagement position in response to linear movement of the pushing member.

\* \* \* \* \*